(12) United States Patent
Chen et al.

(10) Patent No.: US 9,375,087 B1
(45) Date of Patent: Jun. 28, 2016

(54) BRACKET AND MOUNTING DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Hsiao-Han Lu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 14/561,346

(22) Filed: Dec. 5, 2014

(51) Int. Cl.
A47B 88/00 (2006.01)
A47B 96/06 (2006.01)
A47B 96/07 (2006.01)

(52) U.S. Cl.
CPC ............. *A47B 96/061* (2013.01); *A47B 96/07* (2013.01)

(58) Field of Classification Search
USPC ............. 248/220.21, 220.22, 220.31, 220.41, 248/220.43; 211/26, 334.4
See application file for complete search history.

(56) References Cited

U.S. PATENT DOCUMENTS

| | | | | |
|---|---|---|---|---|
| 6,659,577 B2* | 12/2003 | Lauchner | ............. | H05K 7/1421 312/223.1 |
| 6,929,339 B1 | 8/2005 | Greenwald et al. | | |
| 7,552,899 B2* | 6/2009 | Chen | ............. | A47B 88/044 211/26 |
| 7,798,582 B2* | 9/2010 | Yu | ............. | A47B 88/044 211/26 |
| 7,857,145 B2* | 12/2010 | Mushan | ............. | A47B 88/044 211/26 |
| 7,988,246 B2* | 8/2011 | Yu | ............. | A47B 88/044 211/175 |
| 8,104,626 B2* | 1/2012 | Huang | ............. | A47B 88/044 211/26 |
| 8,408,506 B2* | 4/2013 | Yu | ............. | H05K 7/1489 248/219.1 |
| 8,770,528 B2 | 7/2014 | Chen et al. | | |
| 8,967,565 B2* | 3/2015 | Chen | ............. | A47B 88/044 211/192 |
| 2012/0292274 A1 | 11/2012 | Lin et al. | | |
| 2013/0056432 A1 | 3/2013 | Lin et al. | | |

* cited by examiner

*Primary Examiner* — Steven Marsh
(74) *Attorney, Agent, or Firm* — Rosenberg, Klein & Lee

(57) ABSTRACT

A bracket includes a base, at least one mounting member, and a mounting device. The base includes an end plate through which the mounting member extends. The mounting device includes an engaging member and an elastic member. The engaging member includes a supported portion, an engaging projection, and an arm portion connected therebetween. The supported portion is pressed against the base. The arm portion extends through the end plate such that an engaging distance exists between the engaging projection and the end plate. The elastic member applies an elastic force to the engaging member to keep the engaging projection at a predetermined position where, because of the engaging distance, the engaging projection blocks or is engaged with an intended object.

13 Claims, 14 Drawing Sheets

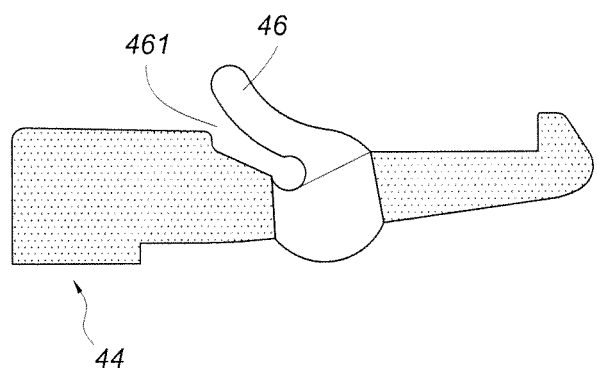
F I G . 2A
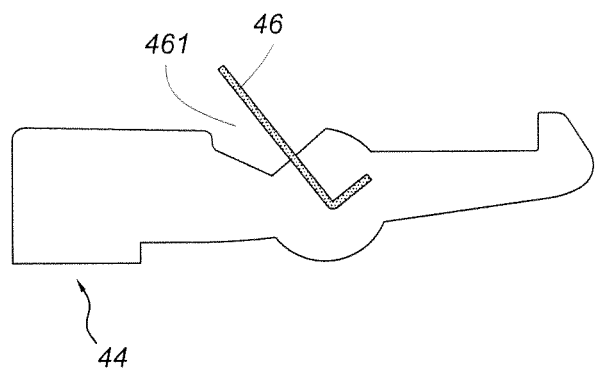
F I G . 2B

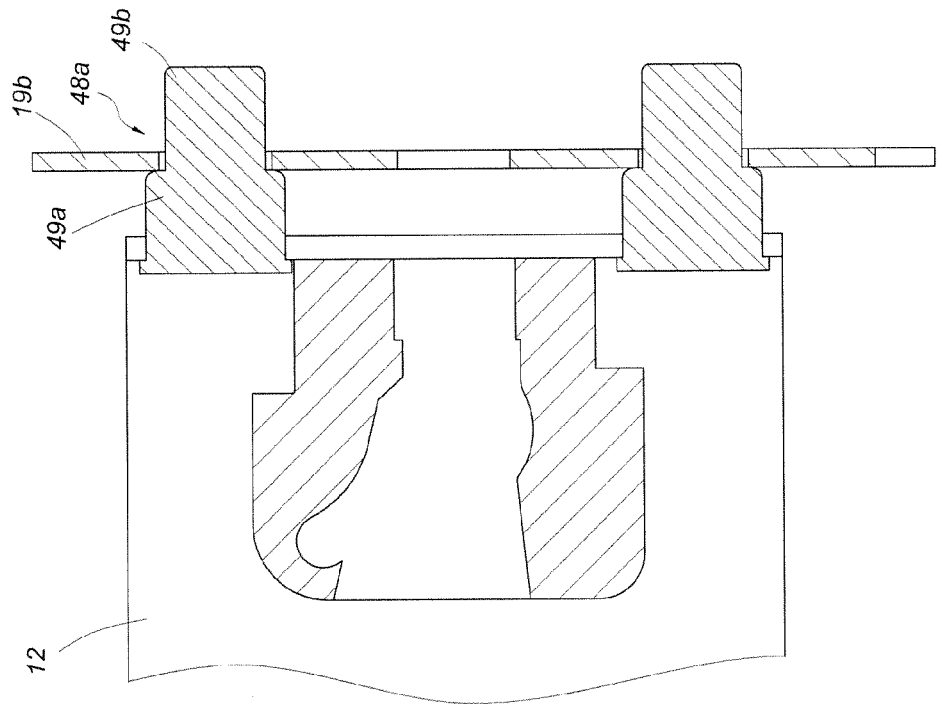
F I G. 5D
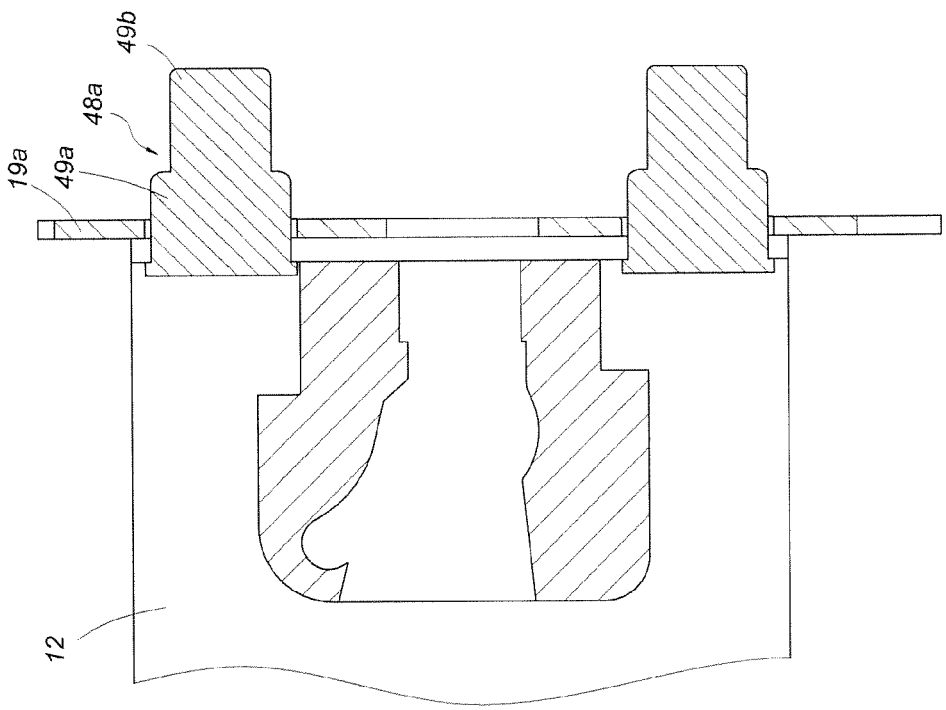
F I G. 5C

BRACKET AND MOUNTING DEVICE THEREOF

FIELD OF THE INVENTION

The present invention relates to a mounting device. More particularly, the present invention relates to a mounting device which can be applied to a bracket, and a bracket which can be mounted to at least one post of a rack via the mounting device.

BACKGROUND OF THE INVENTION

US Patent Application Publication No. 2013/0056432 A1 and U.S. Pat. No. 8,770,528 B2, among other prior art teachings, disclose a mounting device applicable to a bracket so that a slide rail assembly can be mounted to a rack (or more particularly a post of the rack) via a bracket equipped with such a mounting device. The foregoing patent documents are incorporated herein by reference.

According to the embodiments and drawings (e.g., FIGS. 1 and 2) of the specification of the '432 A1 patent application, a mounting apparatus includes a mounting bracket (10), a latch member (30), and a restoring member (50), wherein the latch member (30) is pivotally connected to the mounting bracket (10) via a pivot shaft (53). The mounting apparatus is so configured that, as shown in FIGS. 4 and 5 of the aforesaid specification, a slide rail (70) of a slide rail assembly can be mounted to a rack post (80) with the assistance of the mounting bracket (10). More specifically, once the first segments (141) of the mounting members of the mounting bracket (10) are respectively inserted through and thus positioned in the corresponding locating holes (82) of the rack post (80), the elastic force provided by a resilient member (51) keeps the teeth (321) of the latch member (30) in engagement with the rack post (80) to ensure that the slide rail assembly is securely mounted to the rack post (80).

On the other hand, the embodiments and drawings (e.g., FIGS. 1~3) of the specification of the '528 B2 patent disclose a fastening member (40) which is pivotally connected to the lateral plate (12) of a bracket (10) via a pin (18), and whose fastening portion (46) remains fastened to a post (86) of a rack due to the elastic force provided by a resilient leg (42).

It can be known from the prior art teachings cited above that a mounting device applicable to a bracket typically includes an engaging member to be pivotally connected to a bracket via a pivot pin. While related techniques are in wide application, there remains a specific market demand for this kind of products, making it a worthwhile issue to develop innovative brackets.

SUMMARY OF THE INVENTION

The present invention relates to a novel mounting device which can be applied to a bracket and whose engaging member includes a supported portion functioning as a fulcrum of rotation so that, due to the elastic force applied by an elastic member to the engaging member, the engaging projection of the engaging member can stay at a predetermined position.

According to an aspect of the present invention, a bracket includes a base, at least one mounting member, and a mounting device. The base includes a lateral plate and an end plate generally perpendicularly connected to the lateral plate. The least one mounting member extends through the end plate of the base. The mounting device includes an engaging member and an elastic member. The engaging member includes a supported portion, an engaging projection, and an arm portion connected between the supported portion and the engaging projection, wherein the supported portion is pressed against the base. The elastic member provides an elastic force acting on the engaging member such that the engaging projection of the engaging member is kept at a predetermined position by the elastic force provided by the elastic member. In addition, an engaging distance is defined as the distance between the engaging projection and the end plate of the base, and a supporting length is defined as the distance between a front end of the at least one mounting member and the end plate of the base. The engaging distance is less than the supporting length and greater than the thickness of the object with which the bracket is to be engaged.

Preferably, the elastic member and the engaging member are formed as a single unit, and an elastic space is defined by an included angle between the elastic member and the engaging member.

Preferably, the engaging member and the elastic member are formed by connecting two different materials which include a metal material and a plastic material. The engaging member is formed of one of the metal material and the plastic material while the elastic member is formed of the other of the metal material and the plastic material.

Preferably, the mounting device further includes an auxiliary base mounted to the base. The auxiliary base includes a mounting opening, a first pressed portion, and a second pressed portion. The first pressed portion and the second pressed portion are located at two sides of the auxiliary base respectively. The engaging member is mounted to the auxiliary base through the mounting opening such that the supported portion of the engaging member is pressed against the first pressed portion while the elastic member is pressed against the second pressed portion.

Alternatively, the bracket further includes an auxiliary base mounted to the base, and the engaging member further includes a groove. The auxiliary base includes a mounting opening, a first pressed portion, and a second pressed portion. The first pressed portion and the second pressed portion are located at two sides of the auxiliary base respectively. The engaging member is mounted to the auxiliary base through the mounting opening such that the supported portion of the engaging member is pressed against the first pressed portion while the elastic member is mounted between the second pressed portion and the groove of the engaging member.

Alternatively, an auxiliary base is integrally formed with the base. The auxiliary base includes a mounting opening, a first pressed portion, and a second pressed portion. The first pressed portion and the second pressed portion are located at two sides of the auxiliary base respectively. The engaging member is mounted to the auxiliary base of the base through the mounting opening such that the supported portion of the engaging member is pressed against the first pressed portion while the elastic member is pressed against the second pressed portion.

Preferably, the bracket further includes an inserting member extending through the end plate of the base. The inserting member includes a body and a head connected to the body. The body of the inserting member includes a recessed area and a fastening portion. The fastening portion is located in the recessed area on the side adjacent to the head. The inserting member further includes a channel in which the arm portion of the engaging member is inserted. The engaging projection of the engaging member juts out of the channel in response to the elastic force of the elastic member.

Preferably, the lateral plate of the base has a window, and the engaging member further includes an operation portion corresponding to the window.

Preferably, the at least one mounting member includes a movable rectangular main body, a cylindrical main body, and a spring. The rectangular main body is connected to and can slide with respect to the cylindrical main body. The spring applies an elastic force to the rectangular main body such that the rectangular main body extends out due to the elastic force of the spring.

Preferably, the supported portion of the engaging member includes a curved surface.

According to another aspect of the present invention, a mounting device includes an auxiliary base, an engaging member, and an elastic member. The auxiliary base includes a first pressed portion and a second pressed portion. The engaging member includes a supported portion, an engaging projection, and an arm portion connected between the supported portion and the engaging projection, wherein the supported portion is pressed against the first pressed portion of the auxiliary base. The elastic member, which is pressed against the second pressed portion of the auxiliary base, provides an elastic force acting on the engaging member such that the engaging projection of the engaging member is kept at a predetermined position by the elastic force of the elastic member.

According to still another aspect of the present invention, a bracket for mounting a slide rail assembly to a rack is provided, wherein the rack includes at least one post. The bracket includes a base, at least one mounting member, and a mounting device. The base includes a lateral plate and an end plate generally perpendicularly connected to the lateral plate. The lateral plate is connected to the slide rail assembly. The at least one mounting member extends through the end plate of the base and the at least one post of the rack. The mounting device includes an engaging member and an elastic member. The engaging member includes a supported portion, an engaging projection, and an arm portion connected between the supported portion and the engaging projection, wherein the supported portion is pressed against the base. The elastic member provides an elastic force acting on the engaging member such that the engaging projection of the engaging member is kept at a predetermined position by the elastic force of the elastic member and thus blocks or engages with the at least one post of the rack.

Preferably, the mounting device further includes an auxiliary base mounted to the base. The auxiliary base includes a mounting opening, a first pressed portion, and a second pressed portion. The first pressed portion and the second pressed portion are located at two sides of the auxiliary base respectively. The engaging member is mounted to the auxiliary base through the mounting opening such that the supported portion of the engaging member is pressed against the first pressed portion while the elastic member is pressed against the second pressed portion.

Alternatively, the bracket further includes an auxiliary base mounted to the base, and the engaging member further includes a groove. The auxiliary base includes a mounting opening, a first pressed portion, and a second pressed portion. The first pressed portion and the second pressed portion are located at two sides of the auxiliary base respectively. The engaging member is mounted to the auxiliary base through the mounting opening such that the supported portion of the engaging member is pressed against the first pressed portion while the elastic member is mounted between the second pressed portion and the groove of the engaging member.

One of the advantageous features of applying the present invention is that the engaging member of the mounting device of the bracket includes a supported portion serving as a fulcrum of rotation, allowing the engaging projection of the engaging member to stay at a predetermined position in response to the elastic force applied by an elastic member to the engaging member.

BRIEF DESCRIPTION OF THE DRAWINGS

The invention as well as a preferred mode of use and the advantages thereof will be best understood by referring to the following detailed description of some illustrative embodiments in conjunction with the accompanying drawings, in which:

FIG. 2A is a schematic drawing in which the engaging member and the elastic member of the bracket in an embodiment of the present invention are made of different materials;

FIG. 2B is a schematic drawing in which the engaging member and the elastic member of the bracket in another embodiment of the present invention are also made of different materials;

FIG. 5C is a schematic drawing in which the mounting members of the bracket in yet another embodiment of the present invention correspond in shape to the holes of a post;

FIG. 5D is a schematic drawing in which the mounting members of the bracket in still another embodiment of the present invention correspond in shape to the holes of a post;

DETAILED DESCRIPTION OF THE INVENTION

Figure 1:
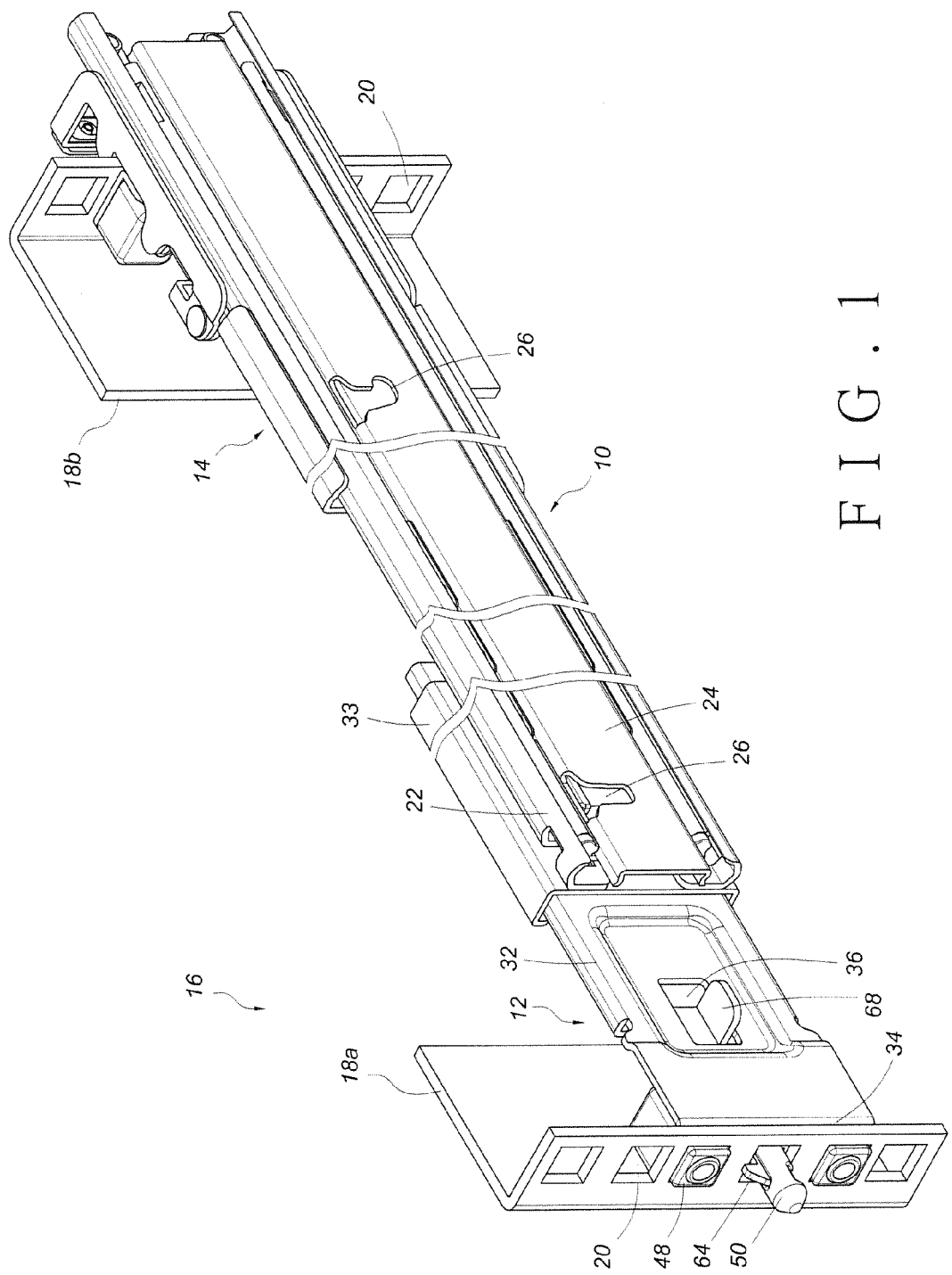
FIG. 1 is a schematic drawing in which the bracket in an embodiment of the present invention is applied to a slide rail assembly so that the slide rail assembly can be mounted to the posts of a rack.

Referring to FIG. 1, the slide rail assembly 10 in an embodiment of the present invention has two corresponding portions (e.g., a front end portion and a rear end portion) mounted to a first post 18a and a second post 18b of a rack 16 via a first bracket 12 and a second bracket 14 respectively. Each of the posts 18a and 18b has a plurality of holes 20.

The slide rail assembly 10 includes a first rail 22 and a second rail 24. The second rail 24 can be longitudinally displaced relative to the first rail 22 and has at least one mounting part 26 via which a chassis (not shown) can be mounted to the slide rail assembly 10.

The following description is provided to shed light on the features of various embodiments of the present invention and is directed to only one of the brackets (i.e., the first bracket 12, hereinafter referred to as the bracket 12 for short) for the sake of simplicity.

Figure 2:
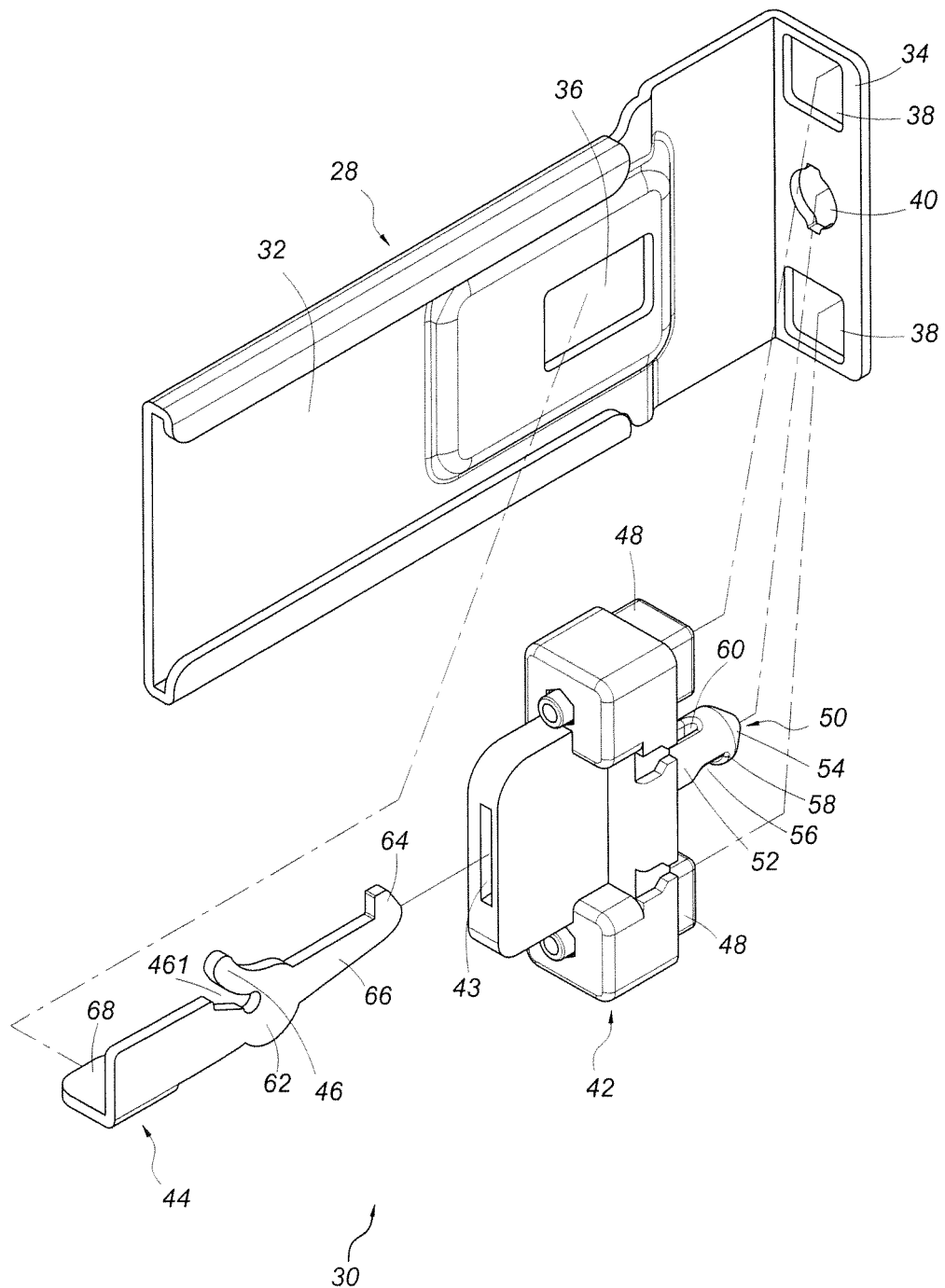
FIG. 2 is an exploded view of the bracket in an embodiment of the present invention.

As shown in FIG. 1 and FIG. 2, the bracket 12 includes a base 28 and a mounting device 30. In a preferred embodiment, the base 28 includes a lateral plate 32 and an end plate 34 generally perpendicularly connected to the lateral plate 32. The lateral plate 32 can be connected to the first rail 22 of the slide rail assembly 10 either directly or indirectly (e.g., via a support 33). The lateral plate 32 has a window 36. The end plate 34 includes a pair of mounting holes 38 and a through hole 40. Here, the through hole 40 is located between the mounting holes 38 by way of example. The mounting holes 38 and the through hole 40 correspond to the holes 20 in either of the posts 18a and 18b of the rack 16 respectively.

The mounting device 30 includes an auxiliary base 42, an engaging member 44 and an elastic member 46. The engaging member 44 is mounted to the base 28 via the auxiliary base 42.

In one embodiment, referring to FIG. 2A and FIG. 2B, the engaging member 44 and the elastic member 46 are formed of two different materials (including a first material, e.g., a metal material, and a second material, e.g., a plastic material) connected together, and an elastic space 461 is defined by an included angle between the elastic member 46 and the engaging member 44. For example, the engaging member 44 is formed of one of the first and the second materials while the elastic member 46 is formed of the other of the first and the second materials. In another embodiment, the elastic member 46 is directly formed with the engaging member 44 and serves to provide an elastic force acting on the engaging member 44. In that case, the material forming the engaging member 44 and the elastic member 46 can be metal or plastic without limitation.

The auxiliary base 42 includes a mounting opening 43 and is mounted to the base 28. More specifically, the bracket 12 further includes a pair of mounting members 48 and an inserting member 50, all of which are provided on the auxiliary base 42. The pair of mounting members 48 and the inserting member 50 correspond to and extend through the mounting holes 38 and the through hole 40 in the end plate 34 of the base 28 respectively. The mounting members 48 and the inserting member 50 also correspond to and are further mounted to the holes 20 of the first post 18a respectively such that the base 28 is mounted to the first post 18a.

The inserting member 50 includes a body 52 and a head 54 connected to the body 52. The body 52 includes a recessed area 56, a fastening portion 58 located in the recessed area 56 on the side adjacent to the head 54, and a channel 60 in communication with the mounting opening 43 of the auxiliary base 42 (as can be seen more clearly in FIG. 3A).

The engaging member 44 includes a supported portion 62, an engaging projection 64, an arm portion 66 connected between the supported portion 62 and the engaging projection 64, and an operation portion 68 connected to the supported portion 62. The operation portion 68 corresponds to the window 36 of the lateral plate 32. In an embodiment, the elastic member 46 is provided at a position opposite and corresponding to the supported portion 62 of the engaging member 44.

Figure 3A:
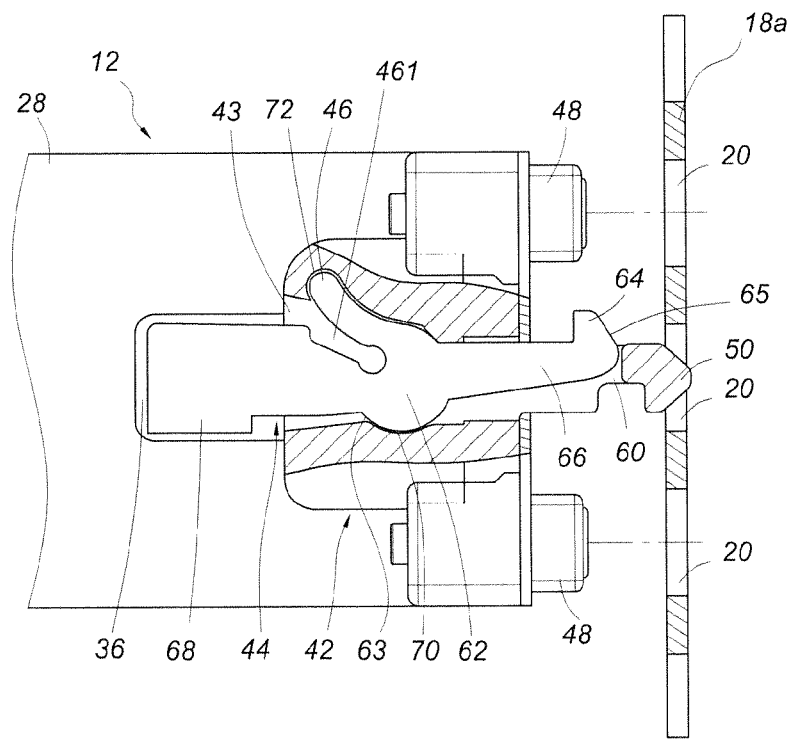
FIG. 3A is a schematic drawing showing how the engaging member of the bracket in an embodiment of the present invention is mounted to an auxiliary base and how the bracket corresponds to a post of a rack.
Figure 3B:
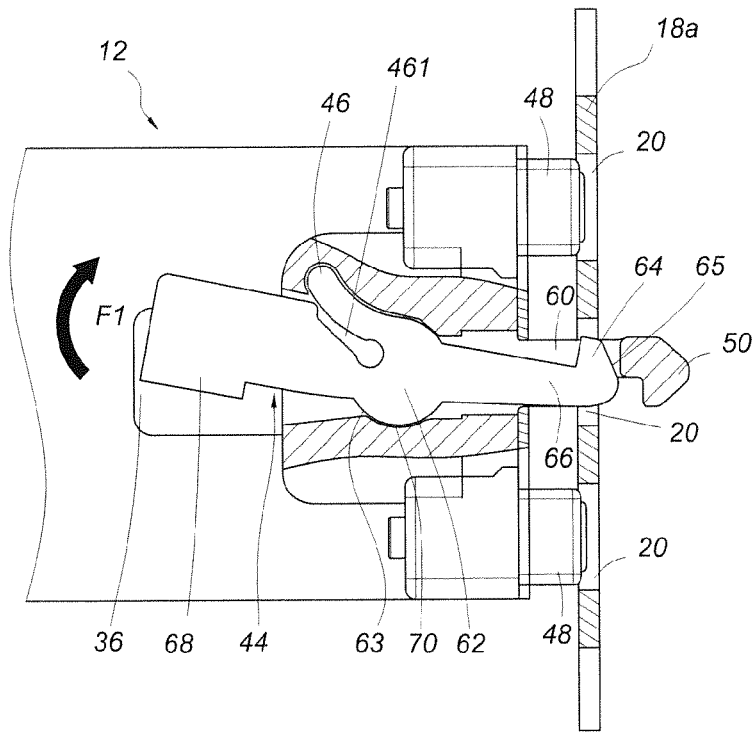
FIG. 3B is a schematic drawing showing how the engaging projection of the engaging member of the bracket in an embodiment of the present invention is shifted so that the bracket can be mounted correspondingly to a post of a rack.

As shown in FIG. 2, FIG. 3A, and FIG. 3B, the interior of the auxiliary base 42 includes a first pressed portion 70 and a second pressed portion 72, which are respectively located at two sides of the auxiliary base 42. Preferably, the first pressed portion 70 and the second pressed portion 72 are adjacent to a lower portion and an upper portion of the auxiliary base 42 respectively and are spaced apart by a predetermined distance. During assembly, the engaging member 44 is inserted into the mounting opening 43 of the auxiliary base 42 until the supported portion 62 of the engaging member 44 is pressed against the first pressed portion 70 of the auxiliary base 42 and the elastic member 46 is pressed against the second pressed portion 72 of the auxiliary base 42. Thus, the engaging member 44 is elastically mounted in the auxiliary base 42, with the arm portion 66 of the engaging member 44 inserted through the channel 60 of the inserting member 50. Preferably, the supported portion 62 and the first pressed portion 70 have corresponding curved surfaces 63 to be pressed against each other.

As the engaging member 44 is mounted to the base 28 via the auxiliary base 42, the supported portion 62 of the engaging member 44 can be viewed as pressed against the base 28 in an indirect manner (i.e., via the auxiliary base 42).

Referring to FIG. 3A and FIG. 3B, when it is desired to mount the bracket 12 to the first post 18a of the rack 16, the operator can operate the operation portion 68 by applying a force F1 through the window 36, such that the elastic member 46 temporarily stores an elastic force in response to the force F1 applied to the operation portion 68 while the engaging member 44 is rotated, with the supported portion 62 serving as a fulcrum, by an angle with respect to the first pressed portion 70. Consequently, the arm portion 66 of the engaging member 44 is shifted, and the engaging projection 64 is drawn into the channel 60 of the inserting member 50, allowing the mounting members 48 and the inserting member 50 to be inserted through the holes 20 of the first post 18a respectively. Preferably, the tip of the engaging projection 64 has an inclined surface 65 corresponding to the first post 18a. In that case, one who wishes to assemble the bracket 12 to either post 18a or 18b of the rack 16 only has to insert the mounting members 48 and the inserting member 50 of the bracket 12 into the holes 20 of the post, and the arm portion 66 of the engaging member 44 will be shifted as the inclined surface 65 of the engaging projection 64 is guided by an inner wall of the corresponding hole 20. The inclined surface 65 makes it possible to assemble the bracket 12 to the post without having to apply a force to the operation portion 68.

Figure 4A:
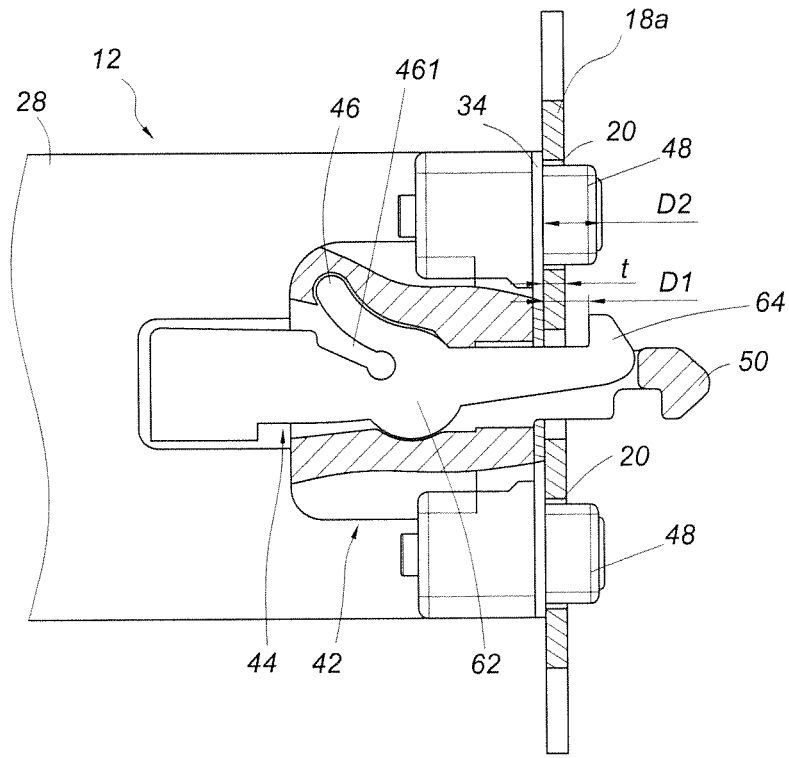
FIG. 4A is a schematic drawing in which the bracket in an embodiment of the present invention is mounted to a post of a rack, and in which the elastic force provided by the elastic member keeps the engaging projection of the engaging member at a position where the engaging projection blocks or is engaged with the post of the rack.

Referring to FIG. 4A, the operator can stop applying the force F1 as soon as the mounting members 48 and the inserting member 50 are inserted through the holes 20 of the first post 18a. The elastic member 46 will then release the stored elastic force, which acts on the engaging member 44, to restore the engaging member 44 to its initial state, in which the engaging projection 64 of the engaging member 44 is kept at a predetermined position. Thus, with the engaging projection 64 of the engaging member 44 blocking or engaged with the first post 18a, the bracket 12 is prevented from falling off from the post 18a. To establish tolerances for dimensional variations, which are inevitable in all mechanism designs, the following parameters are defined in the present embodiment. An engaging distance D1 is defined as the distance between the engaging projection 64 and the end plate 34 of the base 28; a supporting length D2, as the distance between a front end of each mounting member 48 and the end plate 34 of the base 28; and a thickness t, as the thickness of the object with which the bracket 12 is to be engaged (e.g., the first post 18a). As long as the engaging distance D1 is less than the supporting length D2 and greater than the thickness t of the object (e.g., the first post 18a), the bracket 12 can be rapidly mounted to and will not fall off from the object.

Figure 4B:
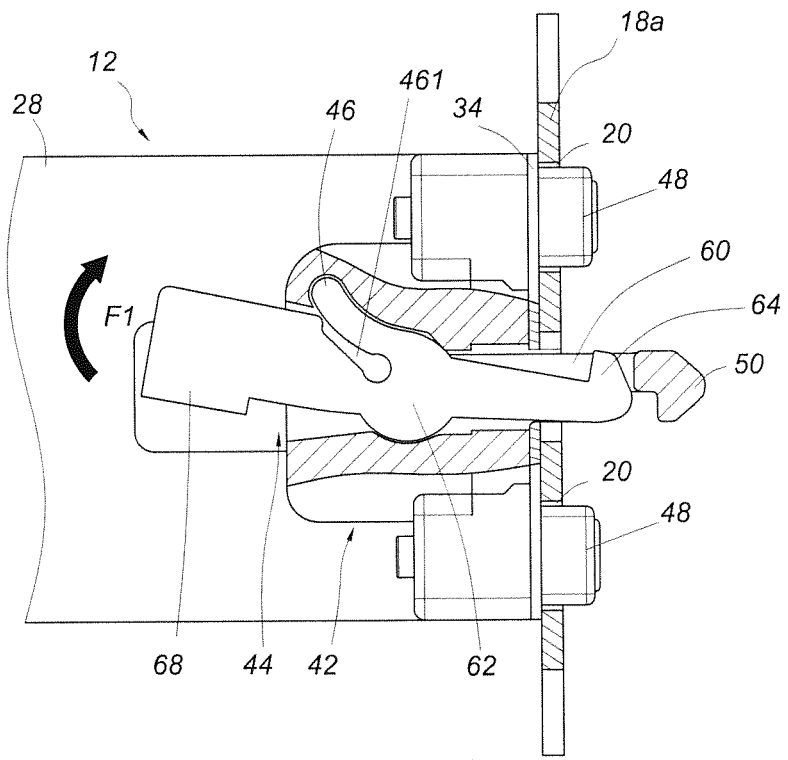
FIG. 4B is a schematic drawing in which the engaging projection of the engaging member of the bracket in an embodiment of the present invention is shifted to allow the bracket to be detached from a post of a rack.

Referring to FIG. 4B, when it is desired to detach the bracket 12 from the first post 18a, the operation portion 68 can be operated in the same way by applying a force F1 thereto so that the engaging projection 64 of the engaging member 44 is drawn into the channel 60 of the inserting member 50. Then, the bracket 12 can be pulled out from the holes 20 of the first post 18a to release the bracket 12 and the first post 18a from the mounted state.

Figure 5A:
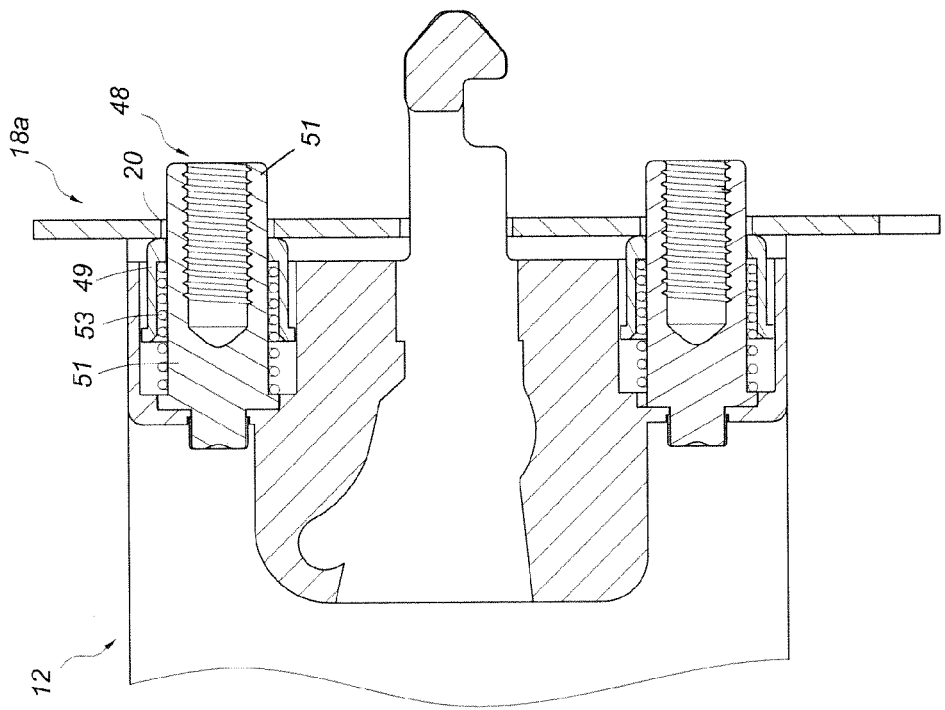
FIG. 5A is a schematic drawing in which the mounting members of the bracket in an embodiment of the present invention correspond in shape to the holes of a post.

FIG. 5A shows the mounting members 48 of the bracket 12 in an embodiment of the present invention. Each mounting member 48 includes a movable rectangular main body 49, a cylindrical main body 51, and a spring 53. The rectangular main body 49 is connected to and can slide with respect to the cylindrical main body 51. The spring 53 applies an elastic force to the rectangular main body 49 such that the rectangular main body 49 extends out due to the elastic force of the spring 53.

Figure 5B:
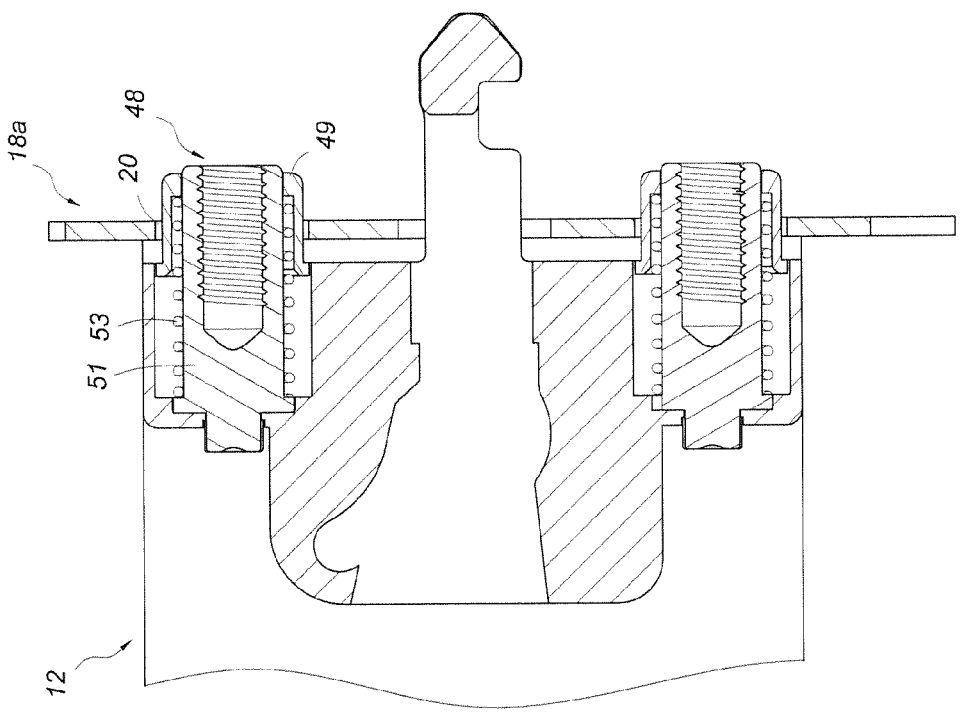
FIG. 5B is a schematic drawing in which the mounting members of the bracket in another embodiment of the present invention correspond in shape to the holes of a post.

If the holes 20 of the first post 18a are rectangular, the rectangular main bodies 49 of the mounting members 48 of the bracket 12 can pass through the corresponding holes 20 of the first post 18a to mount the bracket 12 to the first post 18a. Alternatively, referring to FIG. 5B, if the holes 20 of the first post 18a are circular, the rectangular main bodies 49 of the mounting members 48 of the bracket 12 can be adjusted (i.e., pushed inward) so as to be pressed against the first post 18a while the cylindrical main bodies 51 pass through the corresponding holes 20 of the first post 18a respectively, thereby mounting the bracket 12 to the first post 18a.

It should be understood, however, that the aforesaid shapes of the holes 20 of the first post 18a and the corresponding shapes of the mounting members 48 serve only to illustrate the features of the mounting members 48. In practice, the shapes are by no means limited to those disclosed herein. FIG. 5C and FIG. 5D show mounting members 48a of a different configuration. The mounting members 48a are fixed in form and can be attached to or directly formed by the bracket 12 as appropriate. In the embodiment shown in FIG. 5C and FIG. 5D, each mounting member 48a includes two mounting portions 49a and 49b, which are of different sizes and are intended to be mounted respectively to rack posts 19a and 19b with holes of different diameters.

Figure 6:
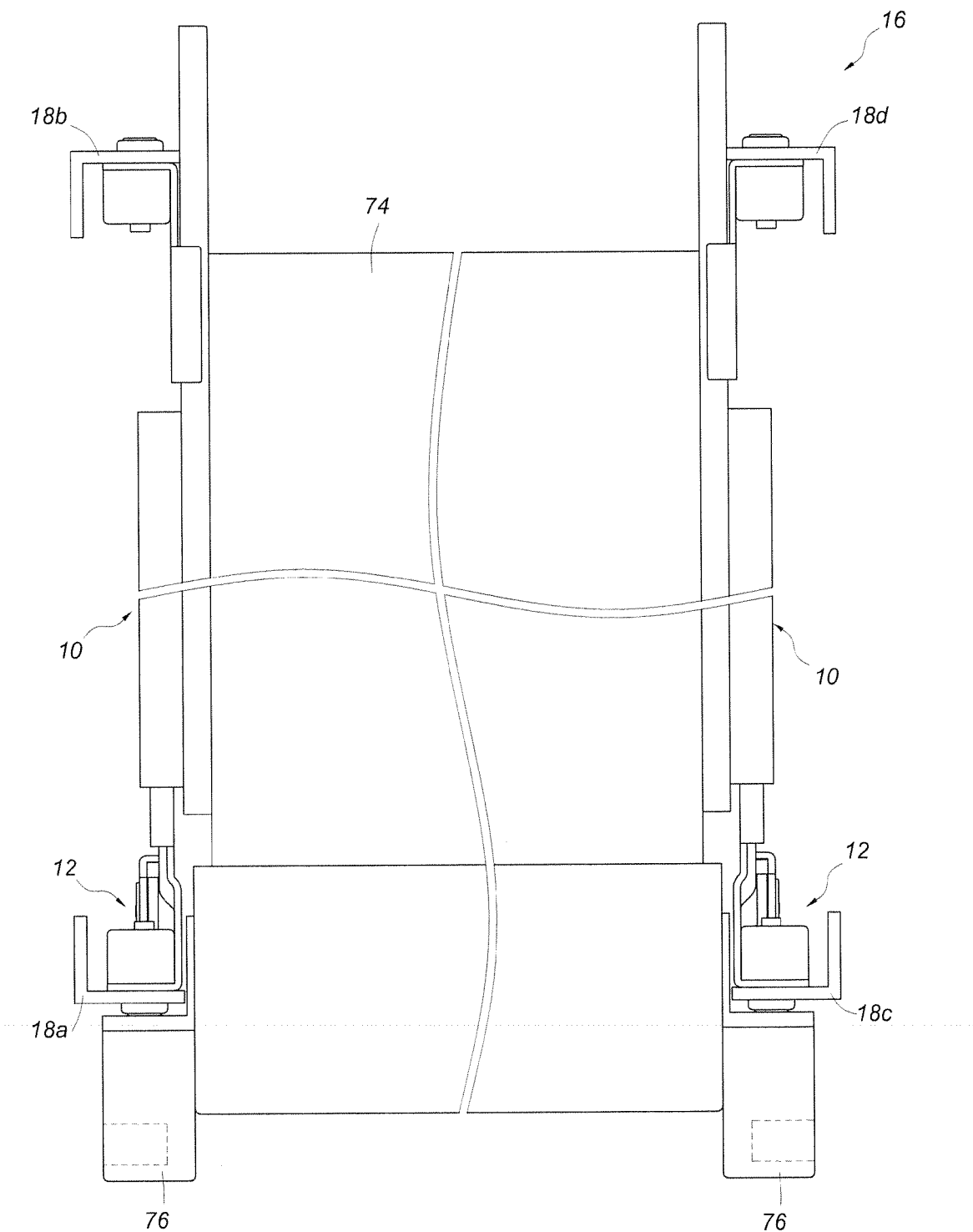
FIG. 6 schematically shows how the bracket in an embodiment of the present invention is applied to a server system.

FIG. 6 shows how a chassis 74 is mounted to the rack 16 via a pair of slide rail assemblies 10. In this embodiment, the rack 16 includes four posts, namely the first post 18a, the second post 18b, a third post 18c, and a fourth post 18d. In a preferred embodiment, the chassis 74 includes at least one fastening device 76. The at least one fastening device 76 corresponds to the bracket 12.

Figure 7:
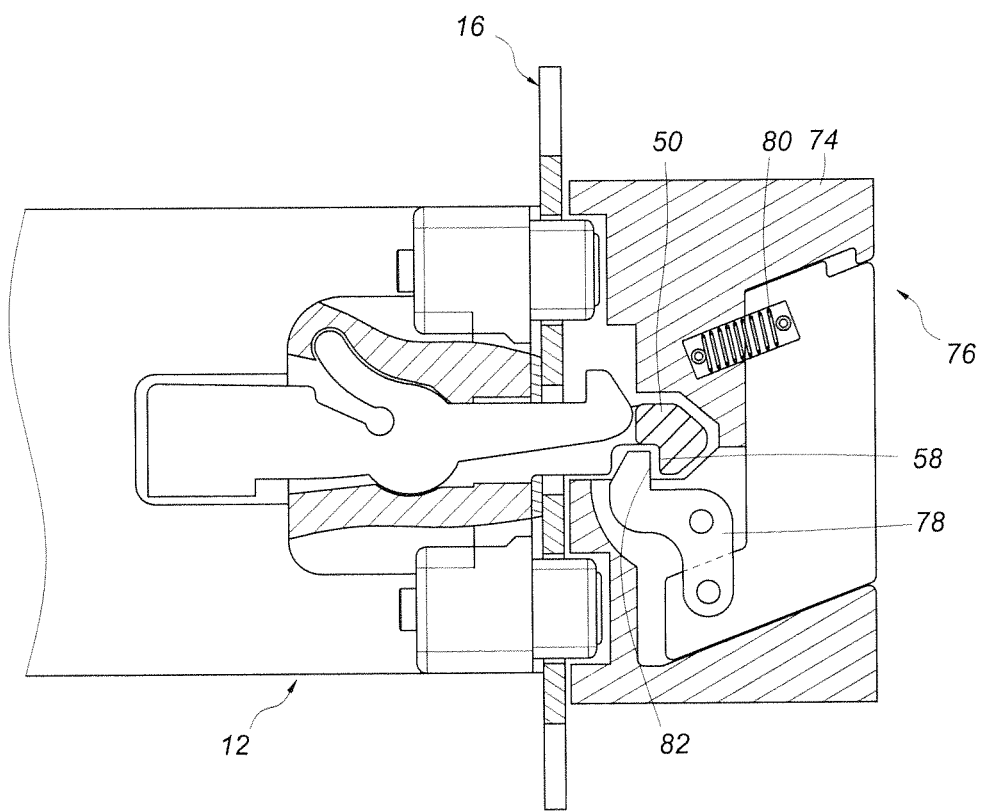
FIG. 7 schematically shows how the fastening device of the chassis in FIG. 6 is fastened with, and fixed in position with respect to, a portion of the bracket.

As shown in FIG. 7, the fastening device 76 includes a fastener 78 and a spring 80. The fastener 78 has a contact portion 82 corresponding to the fastening portion 58 of the inserting member 50 of the bracket 12. The spring 80 applies an elastic force to the fastener 78 such that the contact portion 82 of the fastener 78 stays pressed against, and is thus fixed in position with respect to, the fastening portion 58 of the inserting member 50. This arrangement allows the chassis 74 to be securely fastened to the bracket 12 via the fastening device 76.

Figure 8:
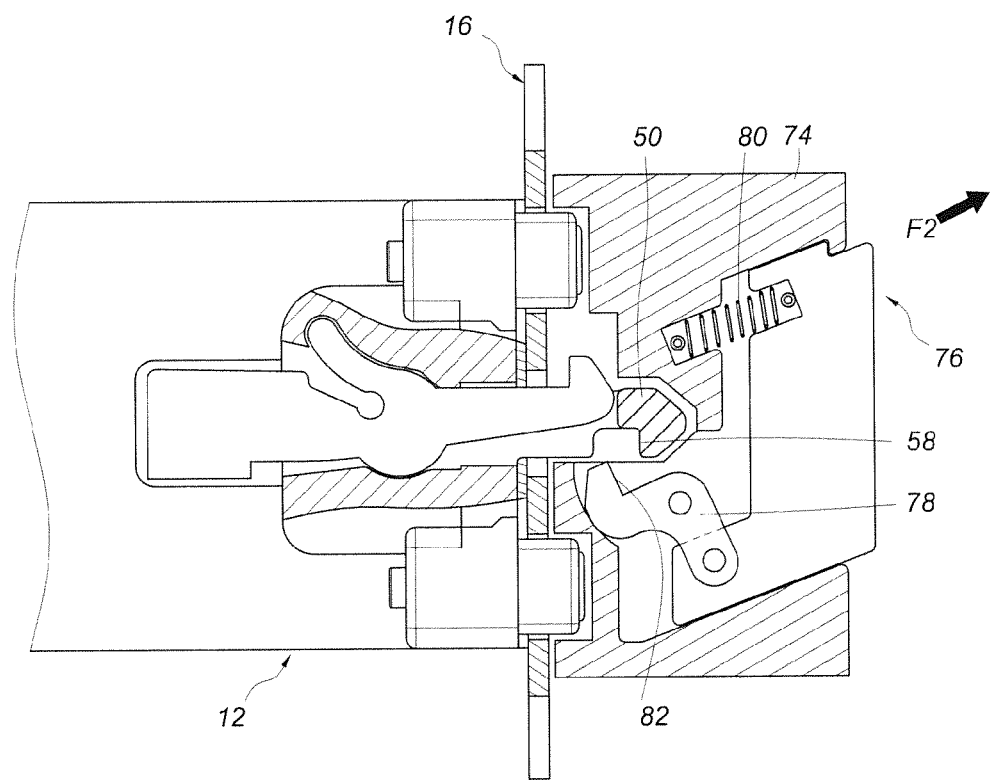
FIG. 8 schematically shows how the fastening device in FIG. 7 is disengaged from the portion of the bracket.

Referring to FIG. 8, when an external force F2 is applied to the fastener 78 of the fastening device 76, the fastener 78 is displaced in response to the external force F2 and overcomes the elastic force generated by the spring 80. As a result, the contact portion 82 of the fastener 78 is moved away from the fastening portion 58 of the inserting member 50, allowing the chassis 74 to be pulled out of the rack 16 with ease, thanks to the bracket 12.

Figure 9:
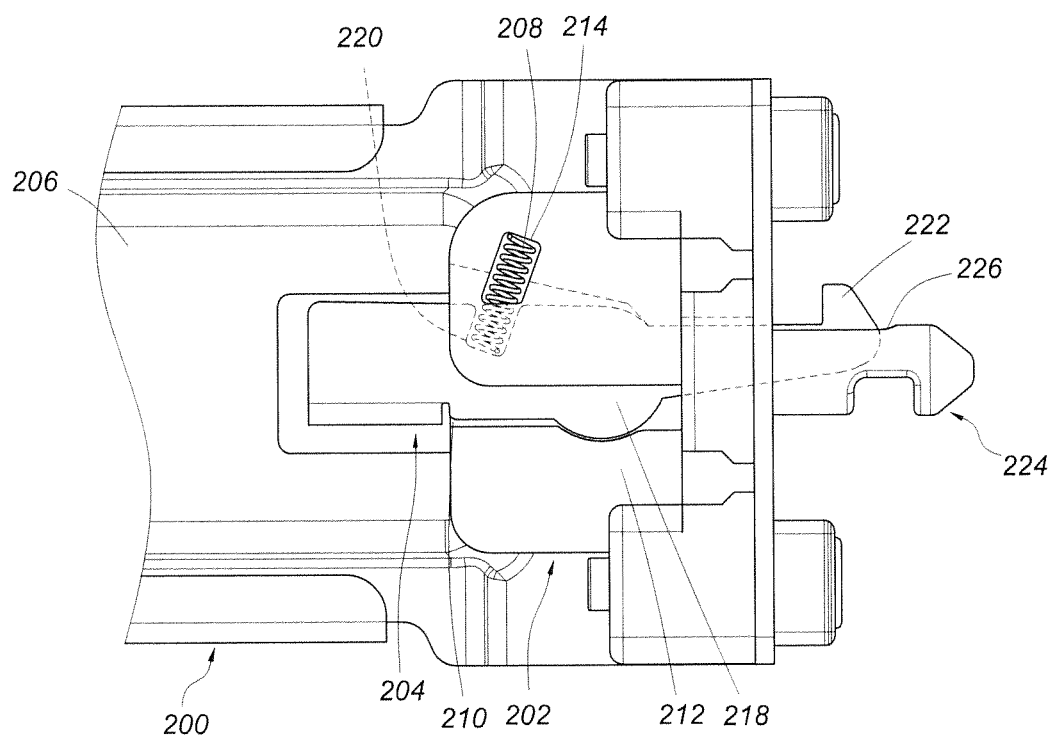
FIG. 9 is a schematic drawing of the bracket in the second embodiment of the present invention.

FIG. 9 shows the bracket in the second embodiment of the present invention.

The bracket 200 includes an auxiliary base 202, an engaging member 204 mounted to a base 206 via the auxiliary base 202, and an elastic member 208.

The auxiliary base 202 includes a mounting opening 210, a first pressed portion 212, and a second pressed portion 214. The first pressed portion 212 and the second pressed portion 214 are respectively located at two sides of the auxiliary base 202. Preferably, the first pressed portion 212 and the second pressed portion 214 are adjacent to a lower portion and an upper portion of the auxiliary base 202 respectively and are spaced apart by a predetermined distance. The engaging member 204 includes a supported portion 218, a groove 220, and an engaging projection 222.

The engaging member 204 is mounted to the auxiliary base 202 through the mounting opening 210. Once the engaging member 204 is mounted to the auxiliary base 202, the supported portion 218 of the engaging member 204 is pressed against the first pressed portion 212, and the elastic member 208 is mounted between the second pressed portion 214 of the auxiliary base 202 and the groove 220 of the engaging member 204. Preferably, the second pressed portion 214 of the auxiliary base 202 is formed with a receiving room for receiving a portion of the elastic member 208.

According to the foregoing structural arrangement, the engaging projection 222 of the engaging member 204 can likewise be held at a predetermined position in response to the elastic force of the elastic member 208. For example, the engaging projection 222 of the engaging member 204 in this embodiment is kept sticking out of the channel 226 of the inserting member 224.

Figure 10:
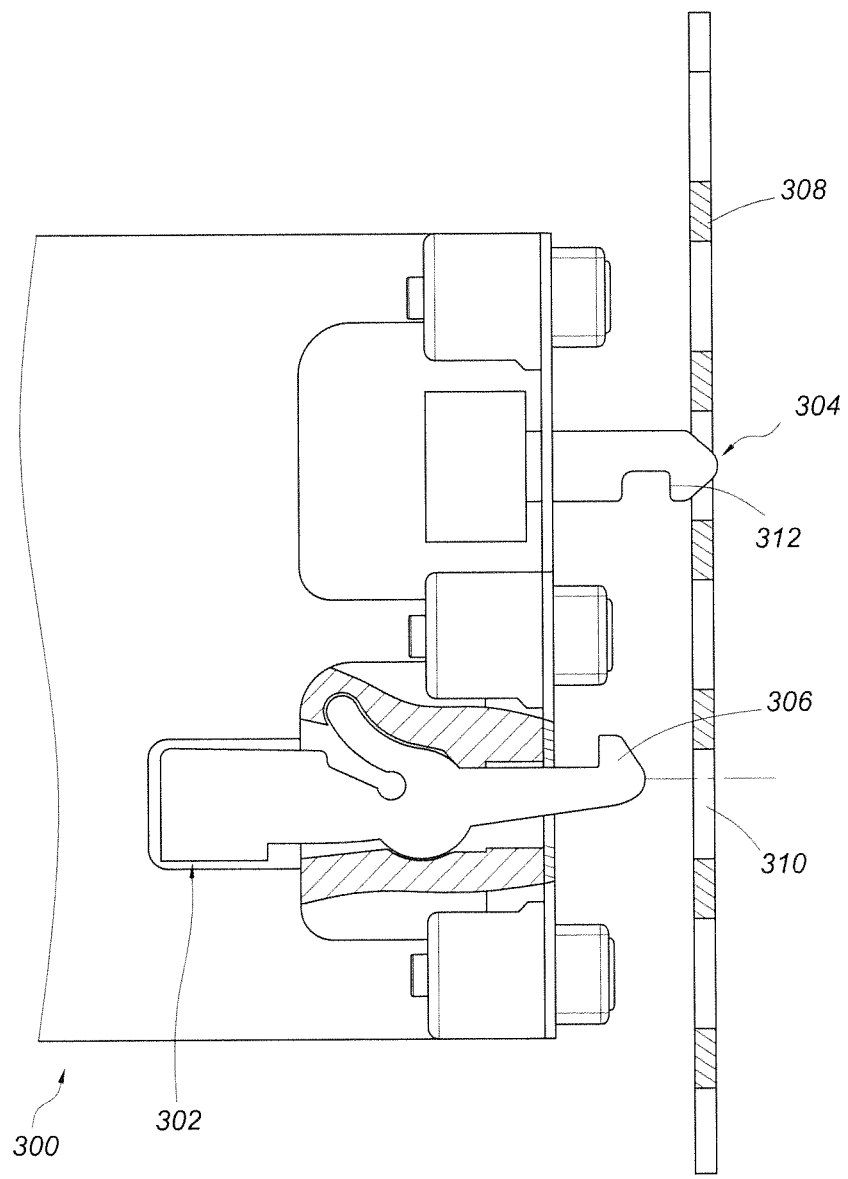
FIG. 10 schematically shows how the bracket in the third embodiment of the present invention corresponds to a post of a rack.

FIG. 10 shows how the bracket in the third embodiment of the present invention corresponds to a post of a rack.

In this embodiment, the engaging member 302 and the inserting member 304 of the bracket 300 are arranged apart from each other. Once the engaging member 302 is operated, the engaging projection 306 of the engaging member 302 and the inserting member 304 can be mounted to the corresponding holes 310 in the post 308 of the rack respectively. The engaging projection 306 of the engaging member 302 serves to block or engage with the post 308 while the fastening portion 312 of the inserting member 304 serves to fasten with the fastening device of a chassis. The principles of the blocking, engaging, and fastening actions have been disclosed in the previous embodiments and, for the sake of simplicity therefore, will not be repeated.

Figure 11:
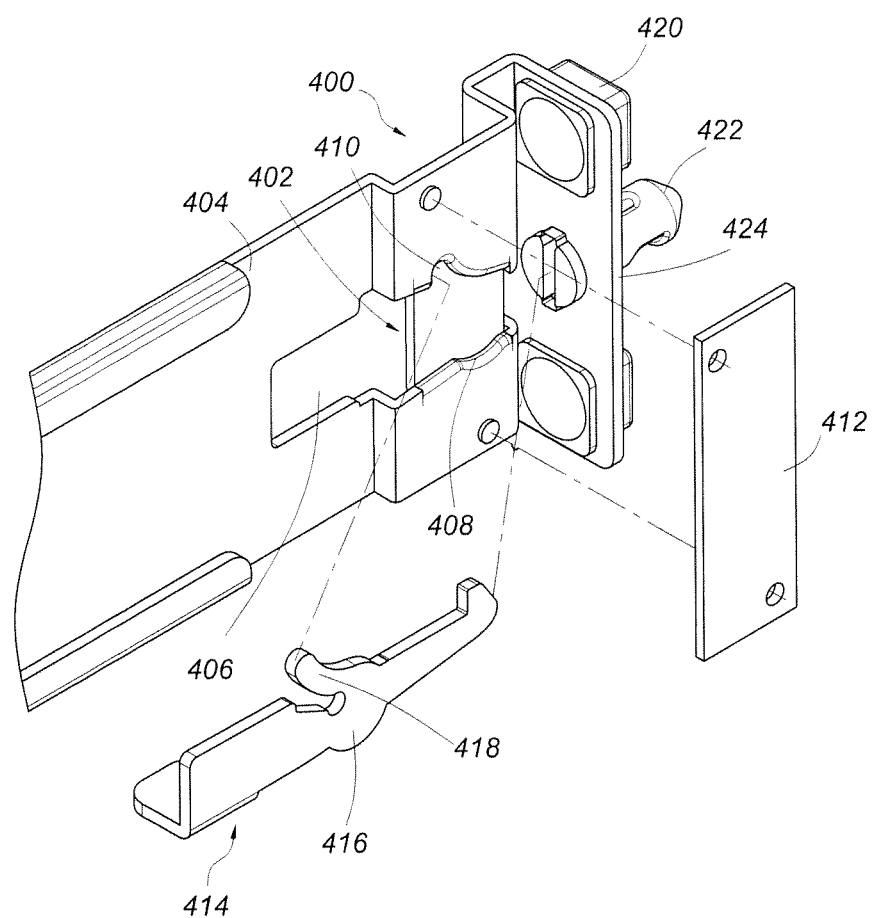
FIG. 11 is a schematic exploded view of the bracket in the fourth embodiment of the present invention.

FIG. 11 discloses the bracket in the fourth embodiment of the present invention.

In this embodiment, the auxiliary base 402 is integrally formed with the base 400 of the bracket. For example, the auxiliary base 402 is directly formed at a portion of the lateral plate 404 of the base 400. The auxiliary base 402 similarly includes a mounting opening 406, a first pressed portion 408, and a second pressed portion 410. The first pressed portion 408 and the second pressed portion 410 are respectively located at two sides of the auxiliary base 402. Preferably, the first pressed portion 408 and the second pressed portion 410 are adjacent to a lower portion and an upper portion of the auxiliary base 402 respectively and are spaced apart by a predetermined distance. In addition, the bracket includes a retaining element 412.

The engaging member 414 is mounted to the auxiliary base 402 of the base 400 through the mounting opening 406 such that the supported portion 416 of the engaging member 414 is directly pressed against the first pressed portion 408 while the elastic member 418 is pressed against the second pressed portion 410. The retaining element 412 serves to block the engaging member 414 and securely retain the engaging member 414 to the base 400. It is worth mentioning that the mounting members 420 and the inserting member 422 in this embodiment are directly mounted to or formed at the end plate 424 of the base 400.

Figure 12:
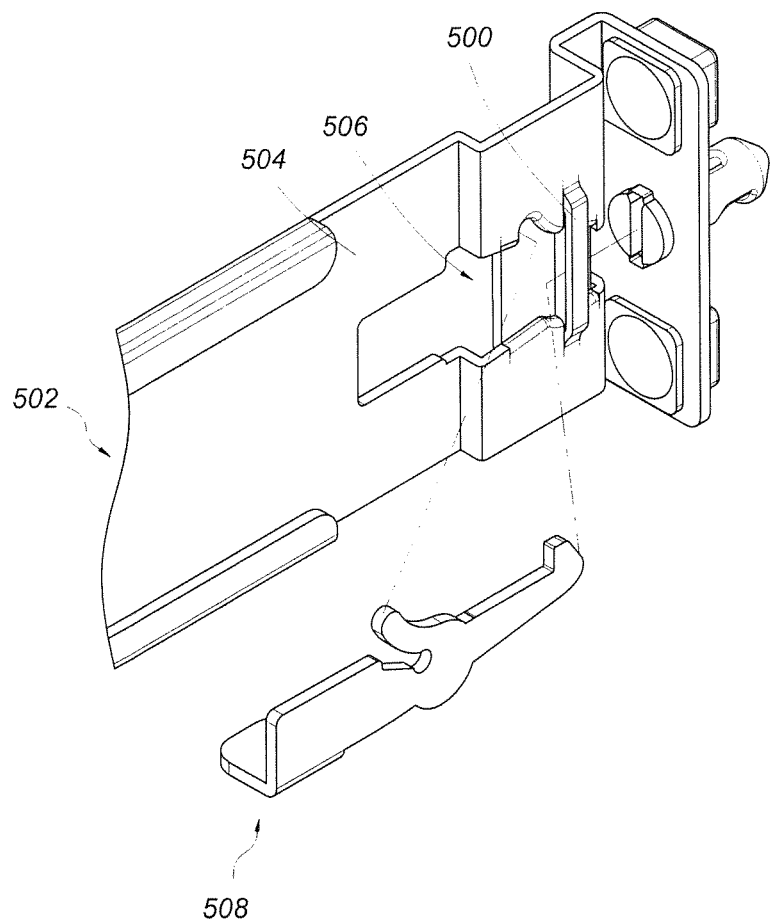
FIG. 12 is a schematic exploded view of the bracket in the fifth embodiment of the present invention.

FIG. 12 shows the bracket in the fifth embodiment of the present invention.

The fifth embodiment is different from the fourth embodiment only in that the retaining element 500 of the bracket is integrally formed with the lateral plate 504 of the base 502 and corresponds to the auxiliary base 506. Once the engaging member 508 is mounted correspondingly to the auxiliary base 506, the retaining element 500 blocks the engaging member 508 and securely retains the engaging member 508 to the base 502.

While the present invention has been disclosed through the foregoing preferred embodiments, it is understood that the embodiments are not intended to be restrictive of the present invention. The scope of patent protection sought is defined by the appended claims.

The invention claimed is:

1. A bracket, comprising:
a base including a lateral plate and an end plate generally perpendicularly connected to the lateral plate;
at least one mounting member extending through the end plate of the base; and
a mounting device including:
an engaging member including a supported portion, an engaging projection, and an arm portion connected between the supported portion and the engaging projection, wherein the supported portion is pressed against the base;
an elastic member providing an elastic force acting on the engaging member such that the engaging projection of the engaging member is kept at a predetermined position by the elastic force provided by the elastic member; and
an inserting member extending through the end plate of the base, the inserting member including a body and a head connected to the body, the body of the inserting member including a recessed area and a fastening portion located in the recessed area on a side adjacent to the head;
wherein a distance between the engaging projection and the end plate of the base is defined as an engaging distance, a distance between a front end of the at least one mounting member and the end plate of the base is defined as a supporting length, and the engaging distance is less than the supporting length and greater than a thickness of an object with which the bracket is to be engaged; and
the inserting member further includes a channel, the arm portion of the engaging member is inserted in the channel of the inserting member, and the engaging projection of the engaging member juts out of the channel in response to the elastic force of the elastic member.

2. The bracket of claim 1, wherein the elastic member and the engaging member are formed as a single unit, and an elastic space is defined by an included angle between the elastic member and the engaging member.

3. The bracket of claim 1, wherein the engaging member and the elastic member are formed by connecting two different materials including a metal material and a plastic material, the engaging member is formed of one of the metal material and the plastic material, and the elastic member is formed of the other of the metal material and the plastic material.

4. The bracket of claim 1, wherein the mounting device further includes an auxiliary base mounted to the base, the auxiliary base includes a mounting opening, a first pressed portion and a second pressed portion, the first pressed portion and the second pressed portion are located at two sides of the auxiliary base respectively, and the engaging member is mounted to the auxiliary base through the mounting opening such that the supported portion of the engaging member is pressed against the first pressed portion and the elastic member is pressed against the second pressed portion.

5. The bracket of claim 1, further including an auxiliary base mounted to the base, the auxiliary base including a mounting opening, a first pressed portion, and a second pressed portion, the first pressed portion and the second pressed portion being located at two sides of the auxiliary base respectively, the engaging member further including a groove, wherein the engaging member is mounted to the auxiliary base through the mounting opening such that the supported portion of the engaging member is pressed against the first pressed portion and the elastic member is mounted between the second pressed portion and the groove of the engaging member.

6. The bracket of claim 1, wherein an auxiliary base is integrally formed with the base, the auxiliary base includes a mounting opening, a first pressed portion and a second pressed portion, the first pressed portion and the second pressed portion are located at two sides of the auxiliary base respectively, and the engaging member is mounted to the auxiliary base of the base through the mounting opening such that the supported portion of the engaging member is pressed against the first pressed portion and the elastic member is pressed against the second pressed portion.

7. The bracket of claim 1, wherein the lateral plate of the base has a window, and the engaging member further includes an operation portion corresponding to the window.

8. The bracket of claim 1, wherein the at least one mounting member includes a movable rectangular main body, a cylindrical main body, and a spring, the rectangular main body is slidably connected to the cylindrical main body, and the spring applies an elastic force to the rectangular main body such that the rectangular main body extends out due to the elastic force of the spring.

9. The bracket of claim 1, wherein the supported portion of the engaging member includes a curved surface.

10. A mounting device, comprising:
an auxiliary base including a first pressed portion and a second pressed portion;
an engaging member including a supported portion, an engaging projection, and an arm portion connected between the supported portion and the engaging projection, wherein the supported portion is pressed against the first pressed portion of the auxiliary base;
an elastic member pressed against the second pressed portion of the auxiliary base, the elastic member providing an elastic force acting on the engaging member such that the engaging projection of the engaging member is kept at a predetermined position by the elastic force provided by the elastic member; and an inserting member extending through the end plate of the base, the inserting member including a body and a head connected to the body, the body of the inserting member including a recessed area and a fastening portion located in the recessed area on a side adjacent to the head;

wherein the inserting member further includes a channel, the arm portion of the engaging member is inserted in the channel of the inserting member, and the engaging projection of the engaging member juts out of the channel in response to the elastic force of the elastic member.

11. A bracket for mounting a slide rail assembly to a rack, the rack including at least one post, the bracket comprising:

a base including a lateral plate and an end plate generally perpendicularly connected to the lateral plate, the lateral plate being connected to the slide rail assembly;

at least one mounting member extending through the end plate of the base and the at least one post of the rack; and a mounting device including:

an engaging member including a supported portion, an engaging projection, and an arm portion connected between the supported portion and the engaging projection, wherein the supported portion is pressed against the base;

an elastic member providing an elastic force acting on the engaging member such that the engaging projection of the engaging member is kept at a predetermined position by the elastic force provided by the elastic member and thus blocks or engages with the at least one post of the rack; and an inserting member extending through the end plate of the base, the inserting member including a body and a head connected to the body, the body of the inserting member including a recessed area and a fastening portion located in the recessed area on a side adjacent to the head;

wherein the inserting member further includes a channel, the arm portion of the engaging member is inserted in the channel of the inserting member, and the engaging projection of the engaging member juts out of the channel in response to the elastic force of the elastic member.

12. The bracket of claim 11, wherein the mounting device further includes an auxiliary base mounted to the base, the auxiliary base includes a mounting opening, a first pressed portion and a second pressed portion, the first pressed portion and the second pressed portion are located at two sides of the auxiliary base respectively, and the engaging member is mounted to the auxiliary base through the mounting opening such that the supported portion of the engaging member is pressed against the first pressed portion and the elastic member is pressed against the second pressed portion.

13. The bracket of claim 11, further including an auxiliary base mounted to the base, the auxiliary base including a mounting opening, a first pressed portion, and a second pressed portion, the first pressed portion and the second pressed portion being located at two sides of the auxiliary base respectively, the engaging member further including a groove, the engaging member being mounted to the auxiliary base through the mounting opening such that the supported portion of the engaging member is pressed against the first pressed portion and the elastic member is mounted between the second pressed portion and the groove of the engaging member.

\* \* \* \* \*